United States Patent [19]
Susak

[11] Patent Number: 6,020,841
[45] Date of Patent: Feb. 1, 2000

[54] DRIVER CIRCUIT FOR LOW VOLTAGE OPERATION OF A SUCCESSIVE APPROXIMATION REGISTER (SAR) ANALOG TO DIGITAL (A/D) CONVERTER AND METHOD THEREFOR

[75] Inventor: David Susak, Phoenix, Ariz.

[73] Assignee: Microchip Technology Incorporated, Chandler, Ariz.

[21] Appl. No.: 09/009,284

[22] Filed: Jan. 20, 1998

[51] Int. Cl.[7] ...................................................... H03M 1/38
[52] U.S. Cl. ............................................ 341/163; 341/161
[58] Field of Search .................................... 341/163, 150, 341/141, 162, 120, 142, 121

[56] References Cited

U.S. PATENT DOCUMENTS 5,880,691  3/1999  Fossum et al. .......................... 341/162

Primary Examiner—Brian Young
Attorney, Agent, or Firm—Paul N. Katz; Ronald L. Chichester; Frohwitter

[57] ABSTRACT

A driver circuit for low voltage operation of a Successive Approximation Register (SAR) based Analog/Digital (A/D) converter is disclosed. The driver circuit has a plurality of cells wherein each cell is used for driving an individual column of a capacitor array. A switching circuit is held within each of the plurality of cells. The switching circuit is used for outputting one of a high voltage level $V_H$ or a low voltage level $V_L$ to an individual column of the capacitor array while driving no DC current. The switching circuit is comprised of a pair of fully differential pass gates. The pass gates are driven by circuitry referenced off of the supply voltage $V_{dd}$ of the A/D converter integrated circuit and ground. Because of this, each pass gate may operate off of any voltage within the $V_{dd}$ to ground range. Thus, the switching circuit allows for low voltage operation with a wider operating range.

16 Claims, 2 Drawing Sheets

DRIVER CIRCUIT FOR LOW VOLTAGE OPERATION OF A SUCCESSIVE APPROXIMATION REGISTER (SAR) ANALOG TO DIGITAL (A/D) CONVERTER AND METHOD THEREFOR

RELATED APPLICATIONS

This application is related to the applications entitled "A SUCCESSIVE APPROXIMATION REGISTER (SAR) FOR CONTROLLING SAMPLING AND CONVERSION OF AN ANALOG TO DIGITAL (A/D) CONVERTER AND METHOD THEREFOR", in the name of Prado et al., and "A CAPACITOR ARRAY FOR A SUCCESSIVE APPROXIMATION REGISTER (SAR) BASED ANALOG TO DIGITAL (A/D) CONVERTER AND METHOD THEREFOR", in the name of the same inventor as the present Application, all filed concurrently herewith, and assigned to the same assignee as this Application. The disclosures of the above referenced applications are hereby incorporated by reference into this application.

BACKGROUND OF THE INVENTION

1. Field of the Invention

This invention relates generally to Analog to Digital (A/D) converters and, more specifically, to a driver circuit for low voltage operation of a Successive Approximation Register (SAR) based Analog to Digital (A/D) converter and a method therefor.

2. Description of the Prior Art

Currently in a Successive Approximation Register (SAR) based A/D converter, an SAR is used to signal a driver circuit to activate different columns of a capacitor array. The driver circuit is presently made up of a plurality of cells wherein each cell is used to drive a respective column of the capacitor array. In its simplest form, each cell houses an inverter which drives its respective column to either $V_H$ or $V_L$.

The problem with using an inverter is that the lowest voltage the driver circuit may operate at is the lowest operating voltage of the inverter. The lowest operating voltage of an inverter is generally $2V_T$ where $V_T$ is the threshold voltage of the transistors that comprise the inverter. Even at this level, one experiences slow response times.

The A/D converter generally has a digital voltage $V_{dd}$ and a digital ground. In general, the digital voltage $V_{dd}$ is the operating voltage of the integrated circuit (IC). For analog sampling there is generally a $V_H$ and $V_L$ on which the samples are based. Since the operating voltage of the inverter is $2V_T$, the inverters limit the sampling range $V_H$ to $V_L$.

Therefore, a need existed to provide an improved driver circuit for an SAR based an A/D converter. The improved driver circuit must be able to operate at lower voltages than a standard inverter circuit. The improved driver circuit must also allow for a wider analog sampling range.

SUMMARY OF THE INVENTION

In accordance with one embodiment of the present invention, it is an object of the present invention to provide an improved driver circuit for an SAR based A/D converter.

It is another object of the present invention to provide an improved driver circuit for an SAR based A/D converter that is able to operate at lower voltages than a standard inverter circuit.

It is still another object of the present invention to provide an improved driver circuit for an SAR based A/D converter that has a wider analog sampling range.

BRIEF DESCRIPTION OF THE PREFERRED EMBODIMENTS

In accordance with one embodiment of the present invention, a driver circuit for low voltage operation of a Successive Approximation Register (SAR) based Analog/Digital (A/D) converter is disclosed. The driver circuit has a plurality of cells wherein each cell is used for driving an individual column of a capacitor array. A switching circuit is held within each of the plurality of cells. The switching circuit is used for outputting one of a high voltage level $V_H$ or a low voltage level $V_L$ to an individual column of the capacitor array while driving no DC current. The switching circuit is comprised of a pair of fully differential pass gates. The pass gates are driven by circuitry referenced off of the supply voltage $V_{dd}$ of the A/D converter integrated circuit and ground. Because of this, each pass gate may operate off of any voltage within the $V_{dd}$ to ground range. Thus, the switching circuit allows for low voltage operation with a wider operating range.

In accordance with another embodiment of the present invention, a method of providing a driver circuit for low voltage operation of a Successive Approximation Register (SAR) based Analog/Digital (A/D) converter is disclosed. The method comprises the steps of providing a plurality of cells wherein each cell is used for driving an individual column of a capacitor array; and providing a switching circuit within each of the plurality of cells for outputting one of a high voltage level $V_H$ or a low voltage level $V_L$ while driving no DC current. The switching circuit is comprised of a pair of fully differential pass gates. The pass gates are driven by circuitry referenced off of the supply voltage $V_{dd}$ of the A/D converter integrated circuit and ground. Because of this, each pass gate may operate off of any voltage within the $V_{dd}$ to ground range. Thus, the switching circuit allows for low voltage operation with a wider operating range.

The foregoing and other objects, features, and advantages of the invention will be apparent from the following, more particular, description of the preferred embodiments of the invention, as illustrated in the accompanying drawings.

DETAILED DESCRIPTION OF THE PREFERRED EMBODIMENTS

Figure 1:
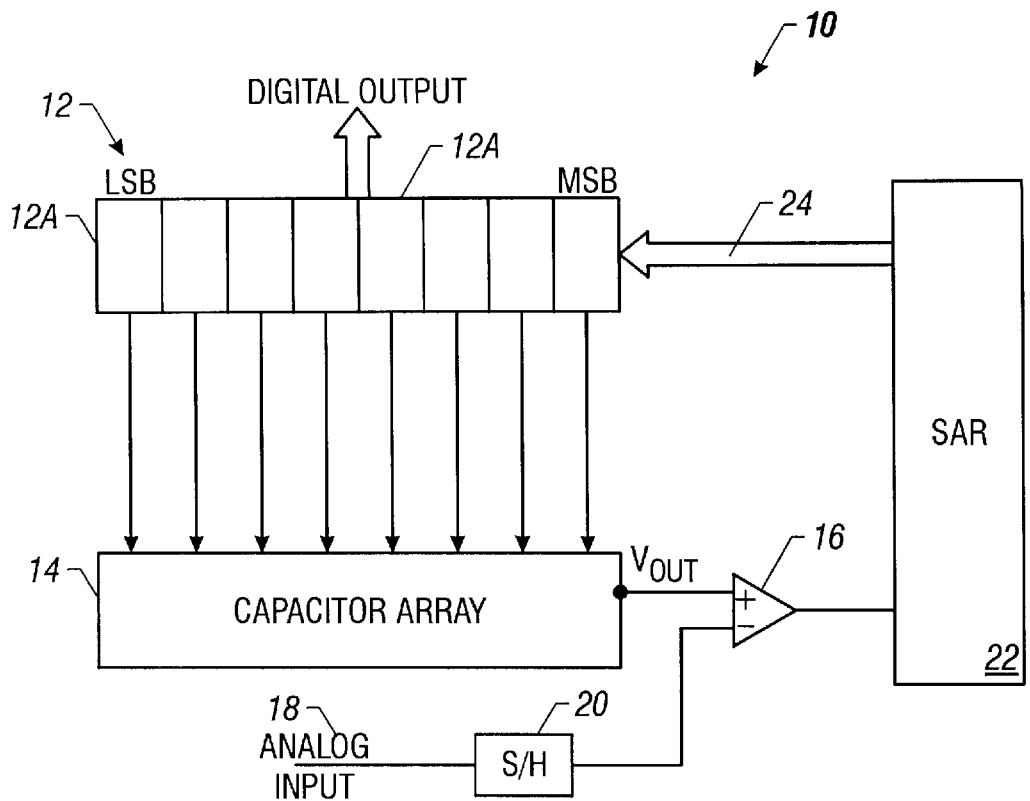
FIG. 1 is a simplified functional block diagram of an Analog to Digital (A/D) converter.

Referring to FIG. 1, an Analog to Digital (A/D) converter 10 is shown. The A/D converter 10 has a driver circuit 12 which is used for driving each row of a capacitor array 14. The driver circuit 12 is comprised of a plurality of cells 12A.

Each cell 12A is used to drive a specific column or bank of the capacitor array 14. By activating and deactivating each bank within the capacitor array 14, the driver circuit 12 may control the output voltage VOUt of the capacitor array 14.

Figure 2:
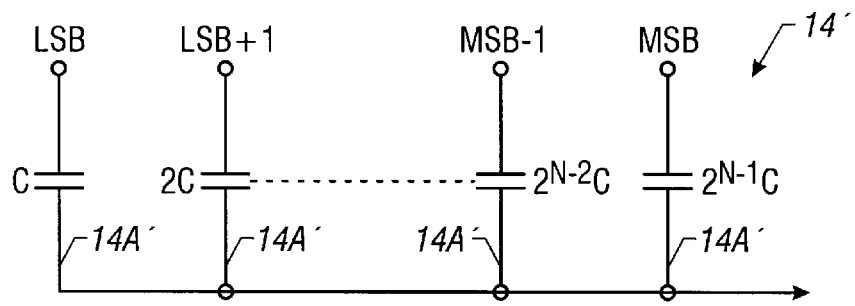
FIG. 2 is a simplified functional block diagram of one embodiment of a capacitor array used in the A/D converter depicted in FIG. 1.
Figure 3:
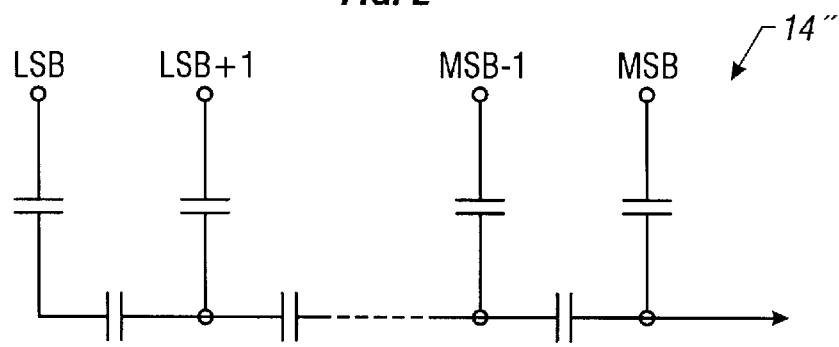
FIG. 3 is a simplified functional block diagram of a second embodiment of a capacitor array used in the A/D converter depicted in FIG. 1.

The capacitor array 14 may take on several different embodiments. The capacitor array 14 may be in the form of a binary weighted capacitor array 14' as depicted in FIG. 2. In the binary weighted capacitor array 14', each capacitor bank 14A' has a capacitance value equal to approximately $2^n$ where n is an integer greater than or equal to 0. The capacitor array 14 may also take the form of a capacitance ladder 14" as depicted in FIG. 3.

Referring back to FIG. 1, the output voltage $V_{out}$ of the capacitor array 14 is sent to one input of a comparator 16. A second input of the comparator 16 is coupled to an output of a sampling circuit 20. The sampling circuit 20 has an input coupled to an analog input signal 18. The sampling circuit 20 will sample the analog signal at timed intervals and send the sampled signal to the comparator 16. The comparator 16 will then compare the voltage of the sampled signal to that of the output voltage $V_{out}$ of the capacitor array 14.

After comparing the two input voltage levels, the comparator 16 will send a signal to a Successive Approximation Register (SAR) 22 on whether the output voltage $V_{out}$ was higher or lower than the sampled voltage. The SAR 22 will then signal the driver circuit 12 on which rows of the capacitor array 14 need to be activated and/or deactivated.

In operation, the Most Significant Bit (MSB) of the driver circuit 12 is first set high while all the other bits 12A in the driver circuit 12 are set to zero. The comparator 16 will then compare the output voltage $V_{out}$ of the capacitor array 14 to the sampled voltage from the sampling circuit 20. If $V_{out}$ is greater than the sampled voltage level, the comparator 16 will signal the SAR 22 that the output voltage $V_{out}$ has over shot the sampled voltage. The SAR 22 will then set the MSB of the driver circuit 12 to zero. The entire process is now repeated for the next cell 12A (i.e., MSB-1). If the output voltage $V_{out}$ does not overshoot the sampled voltage signal, then the cell 12A is a valid bit and is set high. The entire process is carried out for every cell 12A. The driver circuit 12 may then generate a digital output based on the settings of the cells 12A.

Figure 4:
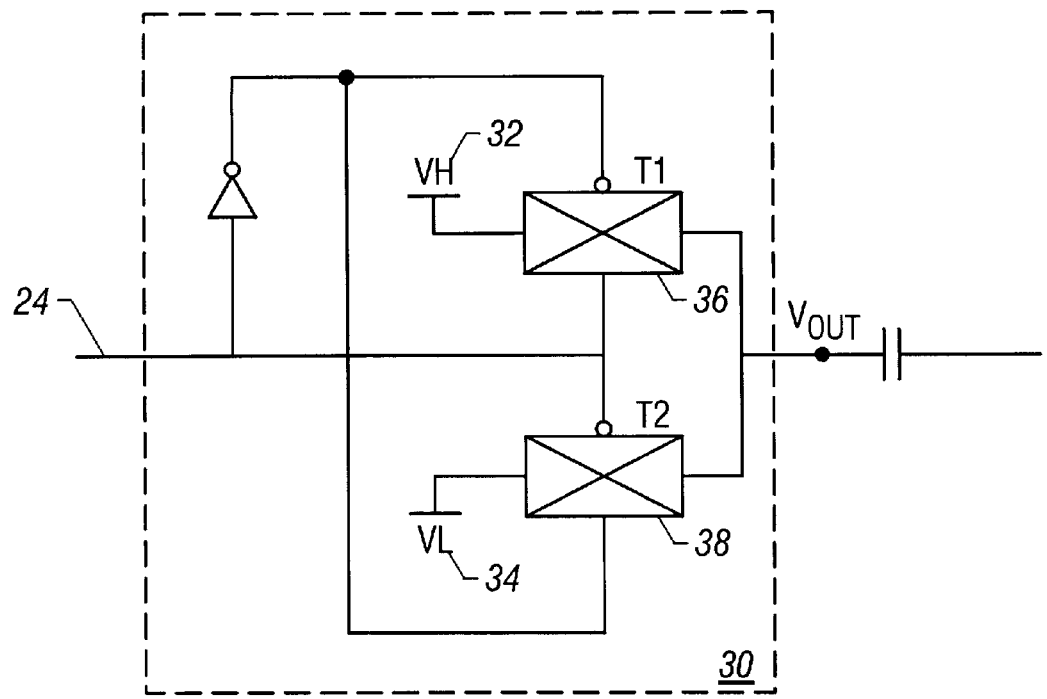
FIG. 4 is a simplified functional block of one cell of the driver circuit used in the SAR based A/D converter depicted in FIG. 1.

Referring now to FIG. 4, each cell 12A of the driver circuit 12 stores a switching circuit 30. The switching circuit 30 is used for outputting either a high voltage level $V_H$ or a low voltage level $V_L$. However, unlike prior art switching circuits, the switching circuit 30 will drive each row of the capacitor array 12 to either $V_H$ or $V_L$ while driving no DC current. The switching circuit 30 is comprised of a pair of fully differential pass gates 36 and 38. The pair of pass gates 36 and 38 are driven by circuitry referenced off of the supply voltage $V_{dd}$ of the A/D converter integrated circuit 10 and ground. Because of this, each pass gate (i.e., 36 or 38) may operate off of any voltage within the $V_{dd}$ to ground range. Thus, the difference between $V_H$ and $V_L$ can be as small as 10 mv or as high as the supply voltage $V_{dd}$. The switching circuit 30 of the present invention thereby allows for low voltage operation with a wider operating range.

Each switching circuit 30 has a first voltage source 32 and a second voltage source 34 for supplying the high and low voltage levels respectively which are used for driving the row of the capacitor array 14. The first pass gate 36 is coupled to the first voltage source 32. The first pass gate 36 is used for outputting the high voltage level $V_H$ to the respective row of the capacitor array 14 while driving no DC current. The second pass gate 38 is coupled to the second voltage source 34. The second pass gate 38 is used for outputting the low voltage level $V_L$ to the respective row of the capacitor array 14 while also driving no DC current. Each pass gate 36 and 38 is coupled to the SAR 22 through the bus 24 (FIG. 1). The SAR 22 will activate or deactivate the respective pass gates 36 and 38 by sending data over the bus 24 in order to drive each column of the capacitor array 14 to one of $V_H$ or $V_L$.

Figure 5:
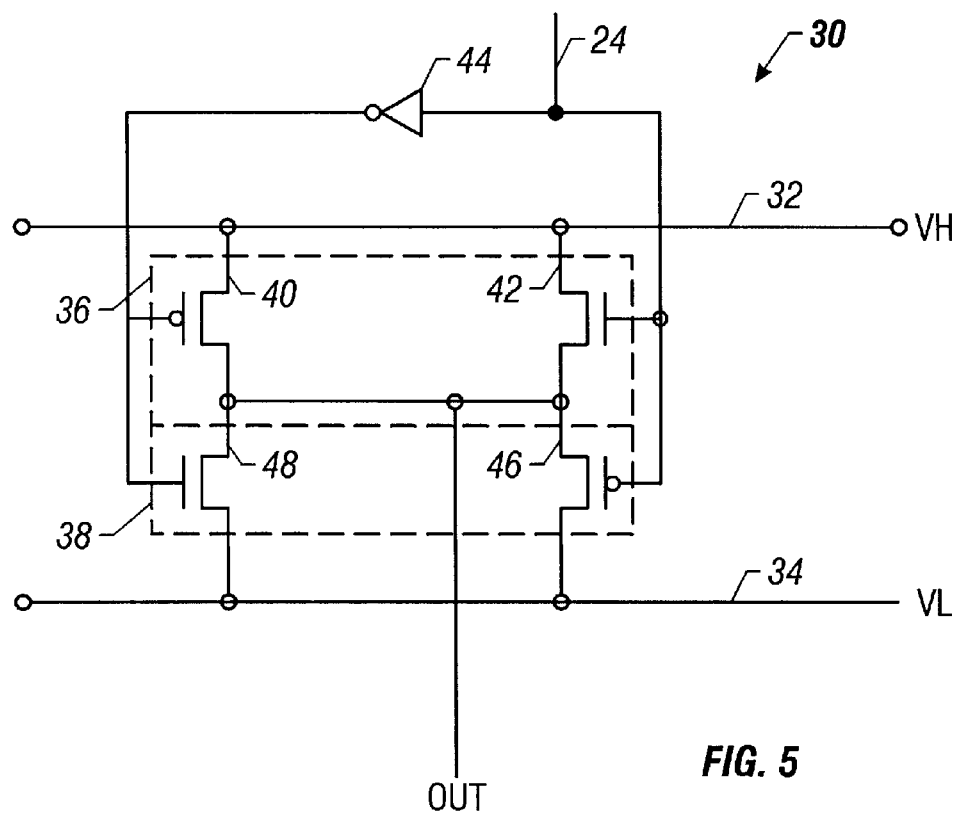
FIG. 5 is an electrical schematic of the cell of the driver circuit depicted in FIG. 4.

Referring to FIG. 5, wherein like numerals and symbols represent like elements, one embodiment of the switching circuit 30 is shown. As can be seen from FIG. 5, each pass gate 36 and 38 are comprised of a PMOS transistor and an NMOS transistor coupled together in parallel. The first pass gate 36 has a PMOS transistor 40 and an NMOS transistor 42 both having drain, gate, and source terminals. The source terminal of the PMOS transistor 40 is coupled to the first voltage source 32 and to the drain terminal of the NMOS transistor 42. The gate terminals of the PMOS transistor 40 and the NMOS transistor 42 are coupled to the bus 24. In the embodiment depicted in FIG. 5, the gate terminal of the PMOS transistor 40 is coupled to the bus 24 through an inverter 44. The drain terminal of the PMOS transistor 40 and the source terminal of the NMOS transistors 42 are coupled together and to the output terminal $V_{out}$ of the capacitor array 14.

Likewise, the second pass gate 38 has a PMOS transistor 46 and an NMOS transistor 48 which are coupled together in parallel. Both the PMOS and the NMOS transistors 46 and 48 have drain, gate, and source terminals. The source terminal of the PMOS transistor 46 is coupled to the second voltage source 34 and to the drain terminal of the NMOS transistor 48. The gate terminals of the PMOS transistor 46 and the NMOS transistor 48 are coupled to the bus 24. In the embodiment depicted in FIG. 5, the gate terminal of the NMOS transistor 40 is coupled to the bus 24 through the inverter 44. The drain terminal of the PMOS transistor 46 and the source terminal of the NMOS transistors 46 are coupled together and to the output terminal $V_{out}$ of the capacitor array 14.

In operation, the SAR 22 will send a signal through the bus 24 to the respective cells 12A of the driver circuit 12. The signal will activate or deactivate both the first and second pass gates 36 and 38 of the respective switching circuit 30. In the embodiment depicted in FIG. 5, if the signal on the bus 24 is a digital high, the PMOS and NMOS transistors 40 and 42 of the first pass gate 36 are activated and the PMOS and NMOS transistors 46 and 48 of the second pass gate 36 are deactivated. Thus, the cell 14A will output a high voltage level output $V_H$ which is used to drive the column of the capacitor array 14. If the signal on the bus 24 is a digital low, the PMOS and NMOS transistors 40 and 42 of the first pass gate 36 are deactivated and the PMOS and NMOS transistors 46 and 48 of the second pass gate 36 are activated. Thus, the cell 14A will output a low voltage level output $V_L$.

The first and the second pass gates 36 and 38 will operate at much lower levels than prior art inverters. This is due to the fact that the pair of pass gates 36 and 38 are driven by circuitry referenced off of the supply voltage $V_{dd}$ of the A/D converter integrated circuit 10 and ground and thus may operate off of any voltage within the $V_{dd}$ to ground range. Since each column of the capacitor array 14 may be switched and driven between a $V_L$ and a $V_H$ from zero to the operating voltage $V_{dd}$, the present invention allows for a wider range of operation.

While the invention has been particularly shown and described with reference to preferred embodiments thereof, it will be understood by those skilled in the art that the foregoing and other changes in form, and details may be made therein without departing from the spirit and scope of the invention.

What is claimed is:

1. A driver circuit for low voltage operation of a Successive Approximation Register (SAR) based Analog/Digital (A/D) converter comprising, in combination:

a plurality of cells wherein each cell is used for driving an individual column of a capacitor array; and a switching circuit within each of said plurality of cells for outputting one of a first voltage level or a second voltage level while driving no DC current.

2. A driver circuit for low voltage operation of an SAR based A/D converter in accordance with claim 1 wherein a level of said second voltage level may be as low as ground potential.

3. A driver circuit for low voltage operation of an SAR based A/D converter in accordance with claim 1 wherein a level of said first voltage level may be as high as a supply voltage of said A/D converter.

4. A driver circuit for low voltage operation of an SAR based A/D converter in accordance with claim 1 wherein each switching circuit comprises:

a first voltage source for supplying said first voltage level;

a second voltage source for supplying said second voltage level;

a first pass gate coupled to said first voltage source for outputting said first voltage level while driving no DC current;

a second pass gate coupled to said second voltage source for outputting said second voltage level while driving no DC current; and a signal circuit coupled to said first pass gate and to said second pass gate for activating and deactivating said first pass gate and said second pass gate for outputting one of said first voltage level or said second voltage level.

5. A driver circuit for low voltage operation of an SAR based A/D converter in accordance with claim 4 wherein each of said first pass gate and said second pass gate comprises:

an NMOS transistor; and a PMOS transistor coupled in parallel with said NMOS transistor.

6. A driver circuit for low voltage operation of an SAR based A/D converter in accordance with claim 4 wherein said signal circuit comprises an inverter coupled to a signal bus wherein said signal bus sends data to activate and deactivate each of said plurality of cells of said driver circuit.

7. A driver circuit for low voltage operation of an SAR based A/D converter comprising, in combination:

a plurality of cells wherein each cell is used for driving an individual column of a capacitor array; and a switching circuit within each of said plurality of cells for outputting one of a first voltage level or a second voltage level while driving no DC current, wherein a level of said second voltage level may be as low as ground potential and a level of said first voltage level may be as high as a supply voltage of said A/D converter, each of said switching circuit further comprising:

a first voltage source for supplying said first voltage level;

a second voltage source for supplying said second voltage level;

a first pass gate coupled to said first voltage source for outputting said first voltage level while driving no DC current;

a second pass gate coupled to said second voltage source for outputting said second voltage level while driving no DC current; and a signal circuit coupled to said first pass gate and to said second pass gate for activating and deactivating said first pass gate and said second pass gate for outputting one of said first voltage level or said second voltage level.

8. A driver circuit for low voltage operation of an SAR based A/D converter in accordance with claim 7 wherein each of said first pass gate and said second pass gate comprises:

an NMOS transistor; and a PMOS transistor coupled in parallel with said NMOS transistor.

9. A driver circuit for low voltage operation of an SAR based A/D converter in accordance with claim 7 wherein said signal circuit comprises an inverter coupled to a signal bus wherein said signal bus sends data to activate and deactivate each of said plurality of cells of said driver circuit.

10. A method of providing a driver circuit for low voltage operation of an SAR based A/D converter comprising the steps of:

providing a plurality of cells wherein each cell is used for driving an individual column of a capacitor array; and providing a switching circuit within each of said plurality of cells for outputting one of a first voltage level or a second voltage level while driving no DC current.

11. The method of claim 10 wherein a level of said second voltage level may be as low as ground potential.

12. The method of claim 10 wherein a level of said first voltage level may be as high as a supply voltage of said A/D converter.

13. The method of claim 10 wherein said step of providing a switching circuit further comprises the steps for each switching circuit of:

providing a first voltage source for supplying said first voltage level;

providing a second voltage source for supplying said second voltage level;

providing a first pass gate coupled to said first voltage source for outputting said first voltage level while driving no DC current;

providing a second pass gate coupled to said second voltage source for outputting said second voltage level while driving no DC current; and providing a signal circuit coupled to said first pass gate and to said second pass gate for activating and deactivating said first pass gate and said second pass gate for outputting one of said first voltage level or said second voltage level.

14. The method of claim 13 wherein said steps of providing said first pass gate further comprises the steps of:

providing an NMOS transistor; and providing a PMOS transistor coupled in parallel with said NMOS transistor.

15. The method of claim 13 wherein said steps of providing said second pass gate further comprises the steps of:

providing an NMOS transistor; and providing a PMOS transistor coupled in parallel with said NMOS transistor.

16. The method of claim 13 wherein said step of providing a signal circuit further comprises the step of providing an inverter coupled to a signal bus wherein said signal bus sends data to activate and deactivate each of said plurality of cells of said driver circuit.

* * * * *